United States Patent [19]

Ishida et al.

[11] Patent Number: 4,489,430
[45] Date of Patent: Dec. 18, 1984

[54] FM STEREO DEMODULATION CIRCUIT

[75] Inventors: Kohji Ishida; Tatsuo Numata; Tadashi Noguchi, all of Tokyo, Japan

[73] Assignee: Pioneer Electronic Corporation, Tokyo, Japan

[21] Appl. No.: 408,993

[22] Filed: Aug. 17, 1982

[30] Foreign Application Priority Data

Aug. 18, 1981 [JP] Japan .................. 56-129855

[51] Int. Cl.$^3$ .............................. H04H 5/00
[52] U.S. Cl. .......................... 381/7; 329/167; 381/3
[58] Field of Search ............ 307/529; 329/50, 124, 329/146, 147, 167, 122; 332/37 R, 41; 381/1-4, 7, 10, 13, 8, 9

[56] References Cited

U.S. PATENT DOCUMENTS

| | | | |
|---|---|---|---|
| 3,514,719 | 5/1970 | Rhodes | 329/50 X |
| 4,069,398 | 1/1978 | Fujie | 381/7 |
| 4,334,125 | 6/1982 | Inoue | 329/50 X |
| 4,362,906 | 12/1982 | Ishida | 381/7 |
| 4,404,430 | 9/1983 | Ogita | 329/124 X |

FOREIGN PATENT DOCUMENTS 56-47140  4/1981  Japan .................. 381/7

Primary Examiner—Stafford D. Schreyer
Assistant Examiner—W. J. Brady
Attorney, Agent, or Firm—Sughrue, Mion, Zinn, Macpeak & Seas

[57] ABSTRACT

A pulse position modulated (PPM) signal is derived from an input FM signal, and first and second switching signals are derived which are opposite in phase and correspond to alternating half cycles of the PPM signal. First and second opposite phase subcarrier signals are derived synchronized to the pilot signal in the input FM signal, and various combinations of the switching and subcarrier signals are multiplied together and the multiplication products combined to obtain left and right channel outputs.

5 Claims, 17 Drawing Figures

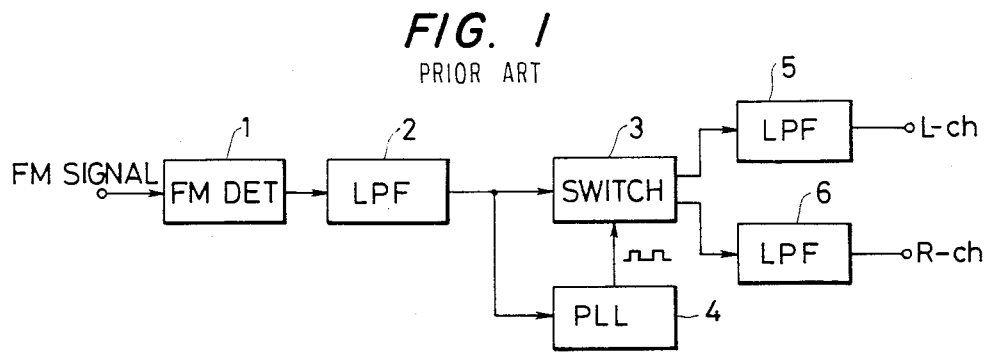
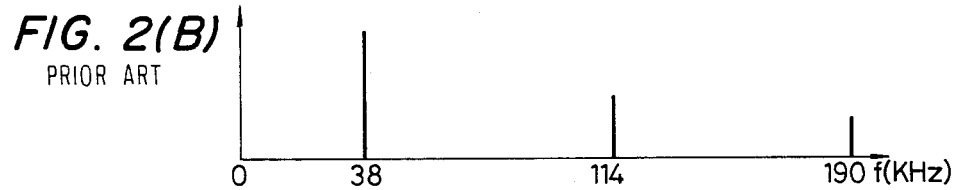
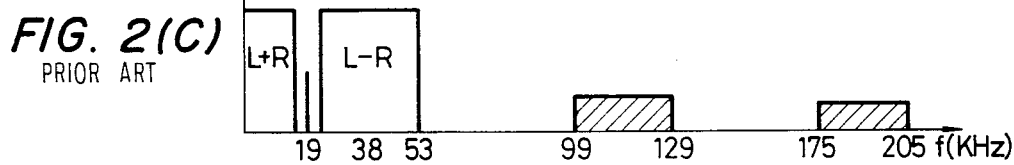
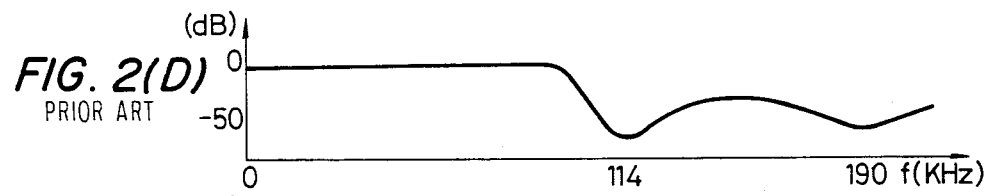
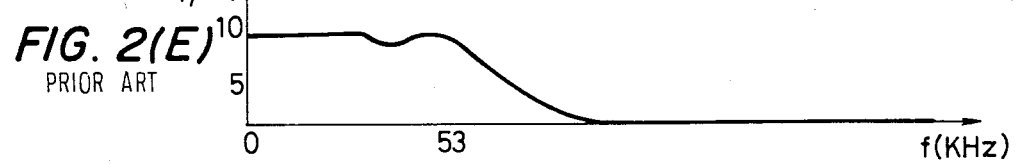

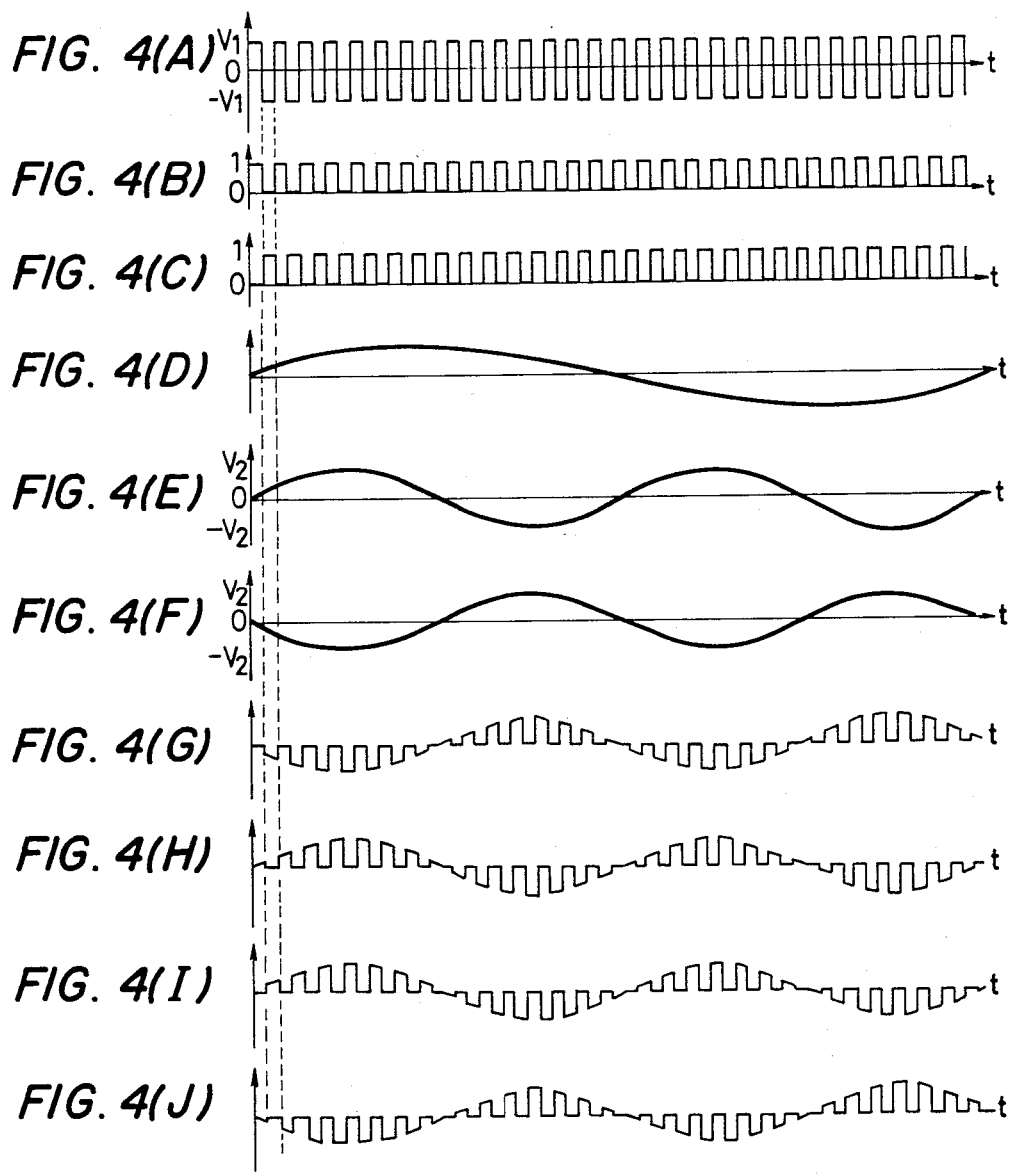

/ 4,489,430 /

FM STEREO DEMODULATION CIRCUIT

BACKGROUND OF THE INVENTION

This invention relates to FM stereo demodulation circuits, and more particularly to an FM stereo demodulation circuit in which a subcarrier signal and a composite signal are subjected to multiplication in the demodulation of a subsignal.

It is known in the art, in the demodulation of an FM stereo signal, to separate the right and the left channel signals by switching the composite signal with a square wave subcarrier signal of 38 KHz. FIG. 1 is a block diagram showing such a circuit system. An FM-IF (intermediate frequency) signal is converted into a composite signal by an FM detector 1. The composite signal is applied to a switching circuit 3 through a LPF (low pass filter) 2 adapted to remove unwanted components. A pilot signal of 19 KHz included in the output of the LPF 2 is extracted by a PLL (phase-locked loop) circuit 4. A square wave subcarrier signal of 38 KHz synchronous in phase with the pilot signal is employed as a switching signal for the switching circuit 3. Audio components, or the right and left channel signals, are separated and led out of the switch output. For this purpose, low-pass filters (LPF) 5 and 6 are provided.

The 38 KHz subcarrier signal used as the switching signal is a square wave as shown in FIG. 2(A). Therefore, the Fourier expansion of this signal is as follows:

$$F(t) = \frac{4}{\pi} \sin \omega st + \frac{4}{3\pi} \sin 3\omega st + \frac{4}{5\pi} \sin 5\omega st + \ldots \quad (1)$$

where $\omega s$ is the angular frequency of the subcarrier. Thus, the frequency spectrum of F(t) includes not only the fundamental wave of 38 KHz but also odd-order harmonics of 114 KHz, 190 KHz and so forth, as shown in FIG. 2(B).

By switching the FM detection output with a switching signal F(t) having such a frequency spectrum, the two signals are subjected to multiplication. Since the pass band of each of the low-pass filters 5 and 6 is 0 to 15 KHz, then the detector output which appears at the stereo output due to the multiplication is as shown in FIG. 2(C). That is, in addition to the main signal (0–15 KHz) and the subsignal (38 + 15 KHz), signals (noise signals or nearby interference waves) of 114±15 KHz, 190±15 KHz and so forth are demodulated as outputs.

In order to eliminate the above-described difficulty, it is necessary to provide low-pass filters having large attenuations at 114 KHz, 190 KHz and so on. However, since 114 KHz is near the composite signal component, the use of the LPF detracts from the flatness of the delay characteristic and amplitude of the composite signal as illustrated in FIGS. 2(E) and 2(D), respectively. As a result, the stereo demodulation output is distorted or the separation characteristic suffers.

SUMMARY OF THE INVENTION

An object of this invention is to provide a stereo demodulation circuit in which the above-described difficulties have been eliminated and which has excellent operating characteristics.

Provided according to this invention is an FM stereo demodulation circuit which comprises: pulse train signal generating means for generating a pulse train signal including a frequency spectrum component of a stereo composite signal which is an FM detection signal; means for generating a sinusoidal subcarrier signal synchronous with a stereo pilot signal in the stereo composite signal; first through fourth signal transmission paths each including series-connected resistance elements; and first through fourth switching elements which are connected between the midpoints of the first through fourth signal transmission paths and a predetermined reference potential point; and in which the opposite phase signal of the pulse train signal is employed as a control signal for the first and fourth switching elements, the normal, or forward, phase signal of the pulse train signal is employed as a control signal for the second and third switching elements, the forward phase signal of the subcarrier signal is applied to the first and second signal transmission paths, the opposite phase signal of the subcarrier signal is applied to the third and fourth signal transmission paths, audio components of outputs of the first and third signal transmission paths and the composite signal are subjected to addition, and audio components of outputs of the second and fourth signal transmission paths and the composite signals are subjected to addition, the addition results being employed as right and left channel signals.

BRIEF DESCRIPTION OF THE DRAWINGS

This invention will now be described with reference to the accompanying drawings in which:

FIG. 1 is a block diagram showing a conventional stereo demodulation circuit;

FIGS. 2(A)–2(E) are diagrams for a description of the characteristics of the circuit in FIG. 1;

FIGS. 4(A)–4(J) are waveform diagrams showing various signals in the circuit of FIG. 3.

DETAILED DESCRIPTION OF THE PREFERRED EMBODIMENT

Figure 3:
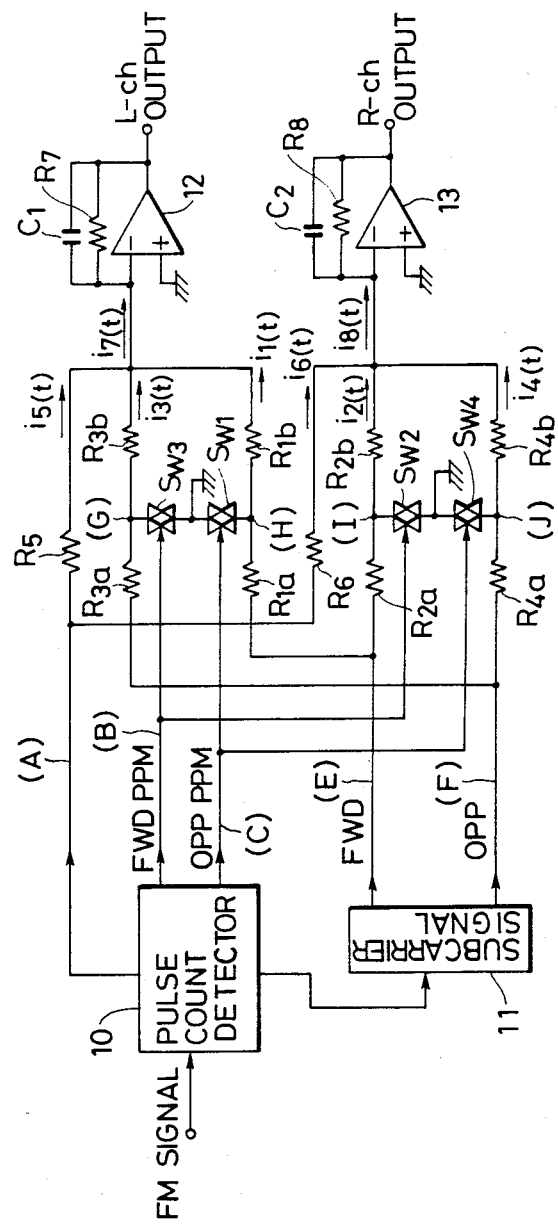
FIG. 3 is a circuit diagram showing one embodiment of this invention.

FIG. 3 is a circuit diagram showing one embodiment of the invention. A pulse count detector 10 is employed as means for generating a pulse train signal having a composite signal frequency spectrum. The detector 10 is responsive to a rising transition in the FM-IF output signal from a limiter, as is well known, to trigger a monostable multivibrator. Therefore, the detector 10 produces a train of pulses having a constant pulse width with the pulse train signal being subjected to position modulation according to each instantaneous frequency of the received FM signal; i.e., a PPM (pulse position modulation) signal. The PPM signal includes the frequency spectrum of a stereo composite signal. This PPM signal can be applied to a low pass filter (LPF) or integrator to provide an FM detection output to the signal generator 11. In this invention, the PPM signal is also directly employed as a switching signal for demodulation.

On the other hand, a phase-locked loop (PLL) subcarrier signal generator 11 is provided in order that a stereo pilot signal of 19 KHz included in the detection output can be extracted and a sinusoidal subcarrier signal, e.g. of 38 KHz, synchronous with the stereo pilot signal obtained. By switching the sinusoidal subcarrier signal with the aforementioned PPM signal, the multiplication of the two signals is obtained, so that the right and left channel signals are separately provided.

For this purpose, a first signal transmission path which is a series circuit of resistor elements $R_{1a}$ and $R_{1b}$ and a second signal transmission path which is a series circuit of resistance elements $R_{2a}$ and $R_{2b}$ are provided. A first subcarrier, hereinafter referred to as a forward phase subcarrier signal, is applied to the first and second signal transmission paths. Furthermore, a third signal transmission path which is a series circuit of resistance elements $R_{3a}$ and $R_{3b}$ and a fourth signal transmission path which is a series circuit of resistance elements $R_{4a}$ and $R_{4b}$ are provided. A second, opposite phase subcarrier signal is applied to the third and fourth signal transmission paths. The midpoints of the first through fourth signal transmission paths, i.e., the connection points of the series-connected resistance elements, are respectively connected through first through fourth analog switching elements $SW_1$ through $SW_4$ to ground or a reference potential point. The on-off operation of each of the first and fourth switching elements $SW_1$ and $SW_4$ is controlled by the opposite phase PPM signal, and the on-off operation of each of the second and third switching elements $SW_2$ and $SW_3$ is controlled by the forward phase PPM signal.

The outputs of the first and third signal transmission paths are connected together and the PPM output is added to these outputs through a resistor $R_5$. The sum of these signal outputs is then applied to an amplifier 12 having a negative feedback circuit comprising a parallel circuit of a resistor $R_7$ and a capacitor $C_1$. The amplifier 12 provides the left channel signal. Similarly, the outputs of the second and fourth signal paths are connected together and the PPM output is added to these outputs through a resistor $R_6$. The sum of these signal outputs is then applied to an amplifier 13 having a negative feedback circuit comprising a parallel circuit of a resistor $R_8$ and a capacitor $C_2$. The amplifier 13 provides the right channel signal.

FIG. 4 shows the wave forms of various signals in the circuit in FIG. 3. FIG. 4(A) shows the PPM signal generated by the pulse count detection circuit; FIGS. 4(B) and 4(C) show the forward and opposite signals, respectively, which are obtained by converting alternate half cycles of the signal shown in FIG. 4(A) into switching element controlling square pulses; FIG. 4(D) shows the stereo pilot signal; FIGS. 4(E) and 4(F) show the forward and opposite signals of the subcarrier signal; FIG. 4(G) shows the switching waveform of the third switching element $SW_3$; FIG. 4(H) shows the switching waveform of the first switching element $SW_1$; FIG. 4(I) shows the switching waveform of the second switching element $SW_2$; and FIG. 4(J) shows the switching waveform of the fourth switching element $SW_4$.

Let it be assumed that the FM stereo composite signal is represented by the following expression (1):

$$C(t) = M(t) + S(t) \sin \omega_s t \tag{1}$$

where M(t) is the main signal and $M(t) = L(t) + R(t)$, S(t) is the subsignal and $S(t) = L(t) - R(t)$, and $\sin \omega_s t$ is the subcarrier. The pilot signal has been omitted from this expression.

Further, let it be assumed that the detection output of the detector 10 includes the composite signal component, and that the carrier frequency of the square wave, i.e., the FM-IF frequency is much higher than the composite signal frequency. Then, as shown in FIG. 4(A), the PPM signal (A) is:

$$V_M(t) = V_1 \cdot K \cdot C(t) + V_1 \cdot f(t) \tag{2}$$

where $V_1$ is the amplitude of the PPM signal, K is a constant which is determined from the FM detection efficiency, and f(t) is a signal which exists near the carrier frequency of the pulse or at a higher frequency.

FIGS. 4(B) and 4(C) show the forward and opposite switching signals of "1" and "0" which are obtained from the (A) signal in FIG. 4(A). These switching signals are:

$$V_{S1} = \tfrac{1}{2}(1 + K \cdot C(t) + f(t)) \tag{3}$$

$$V_{S2} = \tfrac{1}{2}(1 - K \cdot C(t) - f(t)) \tag{4}$$

The subcarrier signals shown in the FIGS. 4(E) and 4(F) are:

$$S_1(t) = V_2 \sin \omega_s t \tag{5}$$

$$S_2(t) = -V_2 \sin \omega_s t \tag{6}$$

In the circuit in FIG. 3, $R_5 = R_6 = R_a$, $R_{1a} = R_{2a} = R_{3a} = R_{4a} = R_b$, $R_{1b} = R_{2b} = R_{3b} = R_{4b} = R_c$, $R_7 = R_8 = R_d$, and $C_1 = C_2 = C_0$.

In the first signal transmission path, the forward phase subcarrier is switched by the opposite phase PPM signal. Therefore, the switching waveform is as shown in FIG. 4(H). From expressions (4) and (5), the output current $i_1(t)$ of this signal transmission path is:

$$\begin{aligned} i_1(t) &= V_{S2}(t) \cdot S_1(t)/(R_b + R_c) \\ &= \frac{V_2}{2(R_b + R_c)} \{\tfrac{1}{2} K \cdot S(t) + K \cdot M(t) \sin \omega_s t \\ &\quad - \tfrac{1}{2} K \cdot S(t) \cos 2\omega_s t + f(t) \sin \omega_s t - \sin \omega_s t\} \end{aligned} \tag{7}$$

In expression (7), the first term represents the sub signal S(t) of 23 to 53 KHz which is subjected to band conversion into an audio component range of 0 to 15 KHz by the multiplication of the composite signal and the subcarrier signal. This is the sub signal for stereo demodulation. The second and third terms are also obtained from the aforementioned multiplication. The fourth term is the multiplication of the subcarrier and the signal f(t) whose signal is much higher than the composite signal, thus providing an extremely high frequency. The fifth term indicates that the subcarrier appears as it is.

Similarly, the output currents $i_2(t)$, $i_3(t)$ and $i_4(t)$ of the second, third and fourth signal transmission paths are:

$$i_2(t) = \frac{V_2}{2(R_b + R_c)} \{\tfrac{1}{2} K \cdot S(t) + K \cdot M(t) \sin \omega_s t - \tfrac{1}{2} K \cdot S(t) \cos 2\omega_s t + f(t) \sin \omega_s t + \sin \omega_s t\} \tag{8}$$

$$i_3(t) = \frac{V_2}{2(R_b + R_c)} \{-\tfrac{1}{2} K \cdot S(t) - K \cdot M(t) \sin \omega_s t + \tfrac{1}{2} K \cdot S(t) \cos 2\omega_s t - f(t) \sin \omega_s t + \sin \omega_s t\} \tag{9}$$

$$i_4(t) = \frac{V_2}{2(R_b + R_c)} \{-\tfrac{1}{2} K \cdot S(t) - K \cdot M(t) \sin \omega_s t + \tfrac{1}{2} K \cdot S(t) \cos 2\omega_s t - f(t) \sin \omega_s t - \sin \omega_s t\} \tag{10}$$

If it is assumed that currents $i_5(t)$ and $i_6(t)$ flow in the resistors $R_5$ and $R_6$, then $$i_5(t) = i_6(t) = \frac{1}{R_a} V_M(t) \quad (11)$$

$$= \frac{V_1}{R_a} \{K \cdot M(t) + K \cdot S(t)\sin \omega_s t + f(t)\}$$

Therefore, an input current $i_7(t)$ to the amplifier 12 is:

$$i_7(t) = i_1(t) + i_3(t) + i_5(t) \quad (12)$$

$$= K\left\{ \frac{V_1}{R_a} M(t) + \frac{V_2}{2(R_b + R_c)} S(t) \right\} +$$

$$K\left\{ \frac{V_1}{R_a} S(t) + \frac{V_2}{R_b + R_c} M(t) \right\} \sin \omega_s t -$$

$$\frac{V_2}{2(R_b + R_c)} K \cdot S(t)\cos 2\omega_s t + \frac{V_1}{R_a} f(t) +$$

$$\frac{V_2}{R_b + R_c} f(t)\sin \omega_s t$$

An input current $i_8(t)$ to the amplifier 13 is:

$$i_8(t) = i_2(t) + i_4(t) + i_6(t) \quad (13)$$

$$= K\left\{ \frac{V_1}{R_a} M(t) - \frac{V_2}{2(R_b + R_c)} S(t) \right\} +$$

$$K\left\{ \frac{V_1}{R_a} M(t) - \frac{V_2}{R_b + R_c} M(t) \right\} \sin \omega_s t +$$

$$\frac{V_2}{2(R_b + R_c)} K \cdot S(t)\cos 2\omega_s t + \frac{V_1}{R_a} f(t) -$$

$$\frac{V_2}{R_b + R_c} f(t)\sin \omega_s t$$

Let us consider the audio components of the 0 to 15 KHz of $i_7(t)$ and $i_8(t)$ with $$\frac{V_1}{R_a} = \frac{V_2}{R_b + R_c} \quad (14)$$

$$i_7(t) = \frac{K \cdot V_1}{R_a} \{M(t) + S(t)\} = \frac{K \cdot V_1}{R_a} \cdot L(t)$$

$$i_8(t) = \frac{K \cdot V_1}{R_a} \cdot R(t) \quad (15)$$

Thus, the right and left channel signals are separated from each other. The outputs of the amplifiers 12 and 13 are:

$$V_L(t) = \frac{1 + S(t) C_0 R_d}{S(t) C_0} \cdot \frac{K \cdot V_1}{R_a} L(t) \quad (16)$$

$$V_R(t) = \frac{1 + S(t) C_0 R_d}{S(t) C_0} \cdot \frac{K \cdot V_1}{R_a} R(t) \quad (17)$$

Thus, de-emphasis can be effected with the time constant $C_0 R_d$.

As is apparent from the above description, according to the invention, the sinusoidal subcarrier is employed as the multiplication signal. Therefore, no unwanted harmonics are included, and accordingly the beat interference which is demodulated by multiplication is eliminated. Hence, it is unnecessary to provide the FM detection output through a LPF, and therefore no distortion is caused. Furthermore, the main signal component $M(t) = L(t) + R(t)$ is not affected by switching because it passes through only the resistors when it is inputted to the output amplifier and not through the switching circuit. The on-off operations of the switching elements $SW_1$ and $SW_2$ and the switching elements $SW_3$ and $SW_4$ are controlled in an opposite phase mode. Accordingly, the impedances as viewed from the input terminals of the forward and opposite subcarrier signals are constant at all times. Therefore, driving is readily achieved, and the unwanted subcarrier signals are advantageously cancelled out.

What is claimed is:

1. An FM stereo demodulation circuit for demodulating into first and second channel signals the audio information contained in an input FM signal having a pilot signal component, said demodulation circuit comprising:

signal generating means for generating from said input FM signal a composite pulse train signal having the frequency spectrum of a stereo composite signal corresponding to FM detection of said input FM signal, a first multiplication signal synchronized with said composite pulse train signal, a second multiplication signal opposite in phase to said first multiplication signal, a firs sinusoidal subcarrier signal synchronized to said pilot signal component and a second sinusoidal subcarrier signal opposite in phase to said first subcarrier signal;

first multiplication means for multiplying said first subcarrier signal and said first multiplication signal;

second multiplication means for multiplying said first subcarrier signal and said second multiplication signal;

third multiplication means for multiplying said second subcarrier signal and said first multiplication signal;

fourth multiplication means for multiplying said second subcarrier signal and said second multiplication signal;

first combining means for combining said composite pulse train signal and outputs of said second and third multiplication means to obtain said first channel signal; and second combining means for combining said composite pulse train signal and outputs of said first and fourth multiplication means to obtain said second channel signal, wherein each of said first through fourth multiplication means comprises a series connection of at least first and second resistors having an input end for receiving a respective one of said first and second subcarrier signals and having an output end for providing a respective multiplication means output, and switch means connected between a reference potential and a point in said series connection between said first and second resistors and selectively coupling said point to said reference potential in response to a switching signal, each of said switch means in said first through fourth multiplication means receiving as its switching signal the respective one of said first or second multiplication signals provided thereto for multiplication.

2. An FM demodulation circuit as claimed in claim 1, wherein said composite pulse train signal comprises a pulse position modulated (PPM) signal comprising a train of pulses of substantially equal pulse width with the timing of each pulse corresponding to the instantaneous frequency of said input FM signal.

3. An FM stereo demodulation circuit as claimed in claim 2, wherein said composite pulse train signal comprises alternating first and second half cycles, said first multiplication signal comprising a first series of pulses corresponding to said first half cycles of said composite pulse train signal.

4. An FM stereo demodulation circuit as claimed in claim 3, wherein said second multiplication signal comprises a second series of pulses corresponding to said second half cycles of said composite pulse train signal.

5. An FM demodulation circuit as claimed in claim 1, wherein each said switch means comprises an analog switch.

* * * * *